United States Patent
Cao

(10) Patent No.: US 12,253,804 B2
(45) Date of Patent: Mar. 18, 2025

(54) METHOD OF FORMING PHOTORESIST PATTERN AND PROJECTION EXPOSURE APPARATUS

(71) Applicant: CHANGXIN MEMORY TECHNOLOGIES, INC., Hefei (CN)

(72) Inventor: Kanyu Cao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 214 days.

(21) Appl. No.: 17/814,017

(22) Filed: Jul. 21, 2022

(65) Prior Publication Data
US 2023/0185201 A1 Jun. 15, 2023

Related U.S. Application Data

(63) Continuation of application No. PCT/CN2022/092049, filed on May 10, 2022.

(30) Foreign Application Priority Data

Dec. 13, 2021 (CN) .......................... 202111515776.3

(51) Int. Cl.
*G03F 7/20* (2006.01)
*G03F 7/00* (2006.01)
*G03F 7/16* (2006.01)

(52) U.S. Cl.
CPC .............. *G03F 7/7015* (2013.01); *G03F 7/16* (2013.01)

(58) Field of Classification Search
CPC .......... G03F 7/7015; G03F 7/16; G03F 7/091; G03F 7/2022; G03F 7/168; G03F 7/70325

See application file for complete search history.

(56) References Cited

U.S. PATENT DOCUMENTS

| | | | |
|---|---|---|---|
| 6,995,833 B2 | 2/2006 | Kato et al. |
| 7,773,195 B2 | 8/2010 | Sewell |
| 8,077,289 B2 | 12/2011 | Fiolka |
| 8,363,315 B2 | 1/2013 | Epple et al. |
| 2005/0078287 A1 | 4/2005 | Sengers et al. |

(Continued)

FOREIGN PATENT DOCUMENTS

| | | |
|---|---|---|
| CN | 1472599 A | 2/2004 |
| CN | 1573404 A | 2/2005 |

(Continued)

OTHER PUBLICATIONS

International Search Report cited in PCT/CN2022/092049 mailed Sep. 16, 2022, 11 pages.

*Primary Examiner* — Mesfin T Asfaw
(74) *Attorney, Agent, or Firm* — Kilpatrick Townsend & Stockton LLP

(57) ABSTRACT

The present disclosure provides a method of forming a photoresist pattern and a projection exposure apparatus. The forming method includes: providing a photoresist layer, and disposing the photoresist layer under a projection objective, wherein a light refracting plate is located between the photoresist layer and the projection objective; and performing an exposure processing on the photoresist layer through the projection objective and the light refracting plate, and forming an exposure image in the photoresist layer, wherein the light refracting plate is configured to reduce a wavelength of optical waves entering the photoresist layer.

18 Claims, 6 Drawing Sheets

(56) References Cited

U.S. PATENT DOCUMENTS

| | | |
|---|---|---|
| 2005/0146704 A1 | 7/2005 | Gruner et al. |
| 2007/0091451 A1* | 4/2007 | Schuster .................. G02B 1/02 359/649 |
| 2007/0127134 A1 | 6/2007 | Corbett |
| 2010/0097592 A1 | 4/2010 | Kraehmer et al. |
| 2011/0134403 A1* | 6/2011 | Feldmann ........... G03F 7/70341 355/53 |
| 2014/0211180 A1 | 7/2014 | Omura |

FOREIGN PATENT DOCUMENTS

| | | |
|---|---|---|
| CN | 2742470 Y | 11/2005 |
| CN | 1965259 A | 5/2007 |
| CN | 1975580 A | 6/2007 |
| CN | 101329516 A | 12/2008 |
| CN | 103149808 A | 6/2013 |
| CN | 107783380 A | 3/2018 |
| TW | 200734827 A | 9/2007 |
| TW | I621921 B | 4/2018 |

* cited by examiner

METHOD OF FORMING PHOTORESIST PATTERN AND PROJECTION EXPOSURE APPARATUS

CROSS-REFERENCE TO RELATED APPLICATIONS

This is a continuation of International Application No. PCT/CN2022/092049, filed on May 10, 2022, which claims the priority to Chinese Patent Application No. 202111515776.3, titled "METHOD OF FORMING PHOTORESIST PATTERN AND PROJECTION EXPOSURE APPARATUS" and filed on Dec. 13, 2021. The entire contents of International Application No. PCT/CN2022/092049 and Chinese Patent Application No. 202111515776.3 are incorporated herein by reference.

TECHNICAL FIELD

The present disclosure relates to, but is not limited to, a method of forming a photoresist pattern and a projection exposure apparatus.

BACKGROUND

As one of the most important process steps in the manufacturing of integrated circuits (ICs), the photolithography process is used to form a desired pattern on a semiconductor substrate. With the development of the IC process and the shrinking of critical dimensions of semiconductor components, the photolithography process is required to have higher precision.

SUMMARY

An overview of the subject matter detailed in the present disclosure is provided below, which is not intended to limit the protection scope of the claims.

The present disclosure provides a method of forming a photoresist pattern and a projection exposure apparatus.

According to a first aspect, the present disclosure provides a method of forming a photoresist pattern, applied to a projection exposure apparatus including a projection objective and a light refracting plate, and including:

providing a photoresist layer, and disposing the photoresist layer under the projection objective, wherein the light refracting plate is located between the photoresist layer and the projection objective; and performing an exposure processing on the photoresist layer through the projection objective and the light refracting plate, and forming an exposure image in the photoresist layer, wherein the light refracting plate is configured to reduce a wavelength of optical waves entering the photoresist layer.

According to a second aspect, the present disclosure provides a projection exposure apparatus, including:

a lighting system, configured to emit an initial beam;

a projection objective, configured to transmit the initial beam and emit an incident beam; and a light refracting plate, disposed at a side of the projection objective, and configured to reduce a wavelength of the incident beam emitted by the projection objective.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may derive other accompanying drawings based on these accompanying drawings without creative efforts.

Figure 1:
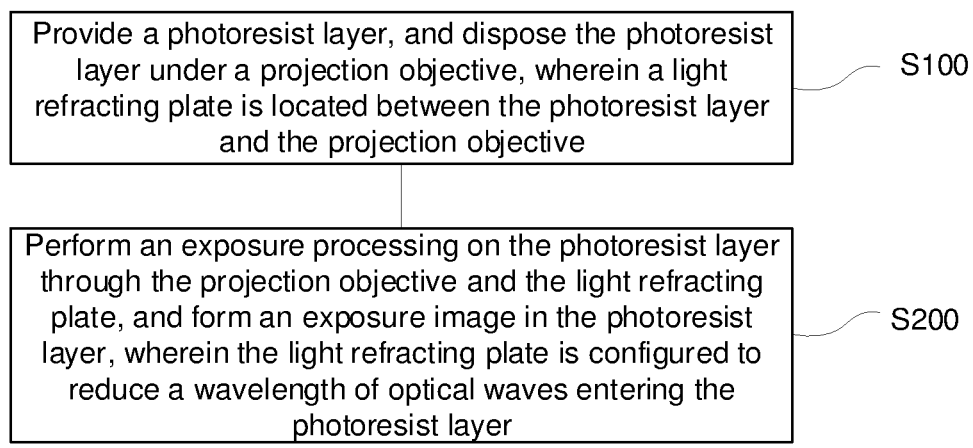
FIG. 1 is a flowchart of a method of forming a photoresist pattern according to an exemplary embodiment.

REFERENCE NUMERALS 10. photoresist layer; 20. target layer; 30. exposure image; 40. projection exposure apparatus; 41. lighting system; 42. projection objective; 43. light refracting plate; 431. refracting plate body; 432. connection portion; 44. first medium layer; 45. objective surrounding structure; 451. first medium defining portion; 5. first incident beam; 6. second incident beam; 7. mask plate.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

An exemplary embodiment of the present disclosure provides a method of forming a photoresist pattern, as shown in FIG. 1. FIG. 1 is a flowchart of a method of forming a photoresist pattern according to an exemplary embodiment of the present disclosure. FIG. 6 to FIG. 11 are schematic diagrams of various stages of the method of forming a photoresist pattern. The method of forming a photoresist pattern is described below with reference to FIG. 6 to FIG. 11.

Figure 7:
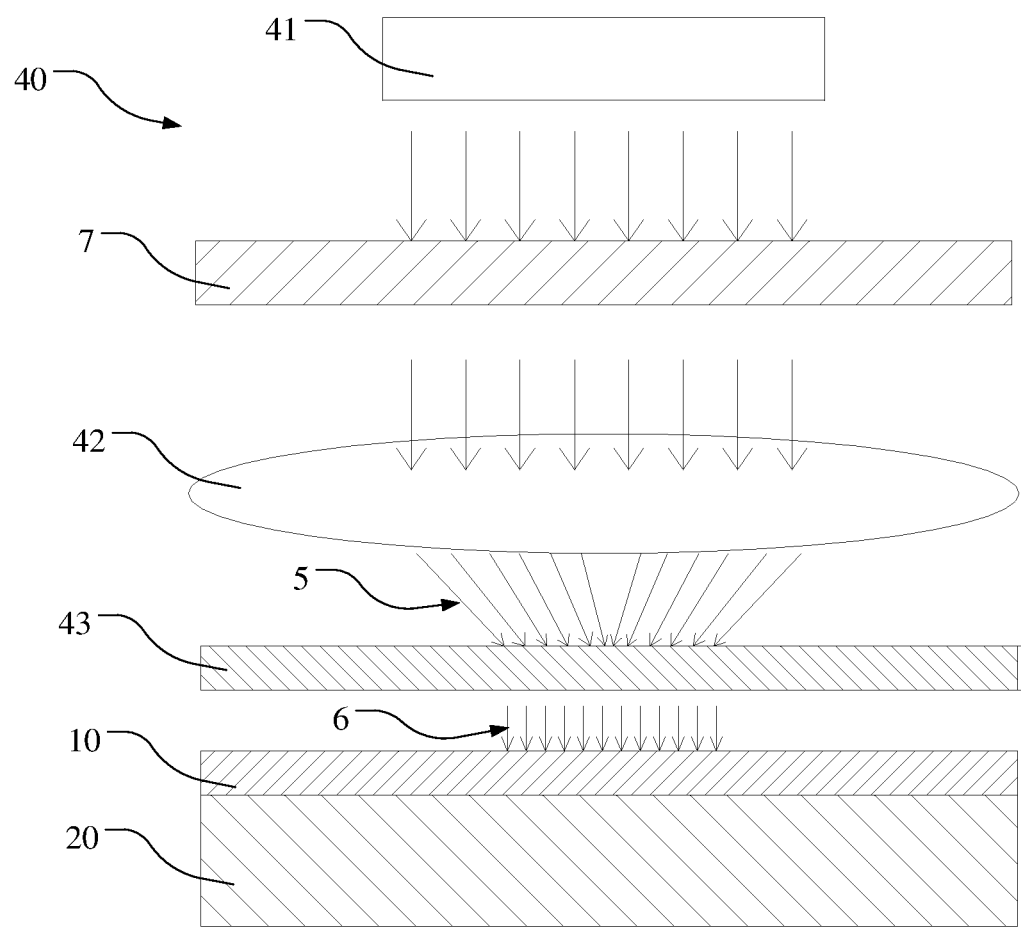
FIG. 7 is a schematic diagram of exposure processing performed by a projection exposure apparatus on a photoresist layer according to an exemplary embodiment.

An exemplary embodiment of the present disclosure provides a method of forming a photoresist pattern. The forming method is applied to a projection exposure apparatus. The projection exposure apparatus is an exposure apparatus that does not make a mask plate in direct contact with a wafer, but transfers images through projection like a projector. As shown in FIG. 7, the projection exposure apparatus 40 includes a projection objective 42 and a light refracting plate 43. A beam emitted by the projection objective 42 enters a photoresist layer 10 after being refracted by the light refracting plate 43. As shown in FIG. 1, the method of forming a photoresist pattern includes the following steps:

Step S100: Provide a photoresist layer, and dispose the photoresist layer under the projection objective, wherein the light refracting plate is located between the photoresist layer and the projection objective.

As shown in FIG. 7, the light refracting plate 43 is located between the photoresist layer 10 and the projection objective 42, such that the incident beam emitted by the projection objective 42 enters the photoresist layer 10 after being refracted by the light refracting plate 43.

Step S200: Perform an exposure processing on the photoresist layer through the projection objective and the light refracting plate, and form an exposure image in the photoresist layer, wherein the light refracting plate is configured to reduce a wavelength of optical waves entering the photoresist layer.

In some embodiments, the light refracting plate 43 can reduce the wavelength of the optical waves entering the photoresist layer 10. During the exposure processing for the photoresist layer 10, a first incident beam 5 emitted by the projection objective 42 is refracted by the light refracting plate 43 and becomes a second incident beam 6 with a smaller wavelength, which enters the photoresist layer 10 to form an exposure image in the photoresist layer 10.

In the lithography process, lithographic resolution affects the quality of the exposure image. With higher lithographic resolution, the formed exposure image has higher precision. The lithographic resolution follows the Rayleigh formula:

$$R = k_1 \frac{\lambda}{NA}$$

where R is a lithographic resolution; k1 is a process constant; $\lambda$ is an exposure wavelength; NA is a numerical aperture (NA) of a projection objective.

The lithographic resolution is used for representing a minimum achievable line width in the lithography process. According to the Rayleigh formula, a smaller wavelength of the incident optical wave and a smaller process constant can result in a smaller line width, that is, higher lithographic precision.

In the method of forming a photoresist pattern in some embodiments, a wavelength of exposure light entering the photoresist layer 10 is reduced by the light refracting plate, to improve the lithographic resolution. Therefore, the exposure image formed on the photoresist layer 10 has higher precision. The method of forming a photoresist pattern according to some embodiments can be used in an exposure process with a smaller lithographic critical dimension and more complex and diverse structures.

Figure 2:
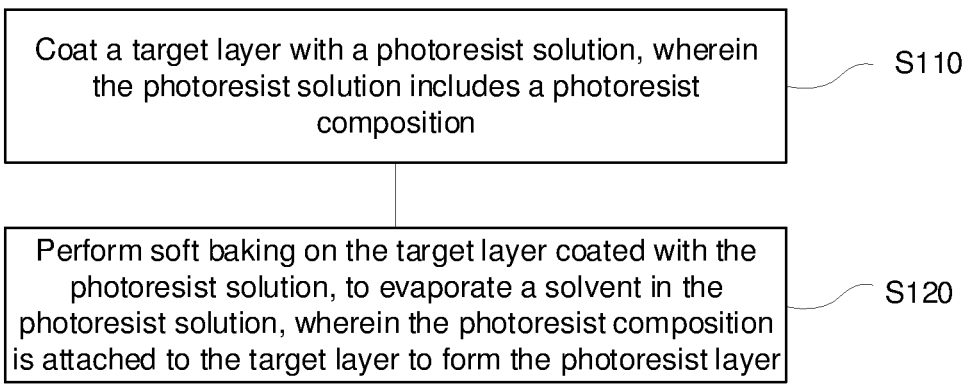
FIG. 2 is a flowchart of forming a photoresist structure in a method of forming a photoresist pattern according to an exemplary embodiment.

According to an exemplary embodiment, the implementation of the forming process of the photoresist layer 10 in step S100 is described in some embodiments. As shown in FIG. 2, the implementation process includes the following steps:

Step S110: Coat a target layer with a photoresist solution, wherein the photoresist solution includes a photoresist composition.

Figure 6:
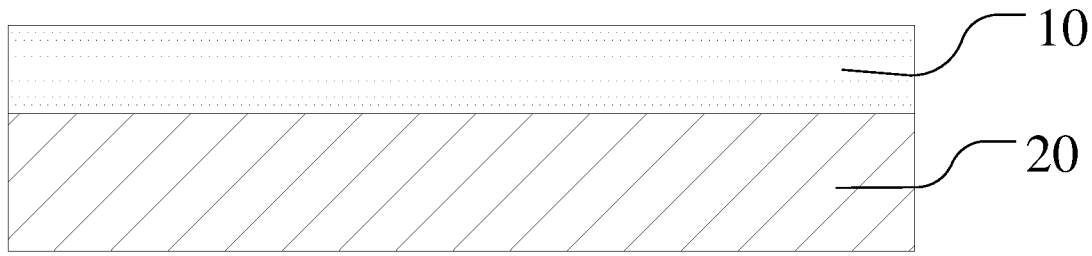
FIG. 6 is a schematic diagram of forming a photoresist layer on a target layer in a method of forming a photoresist pattern according to an exemplary embodiment.

The photoresist solution includes a photoresist composition and a solvent, where the photoresist composition includes a photo-acid generator, a polymer resin, or the like. Referring to FIG. 6, the photoresist solution is coated on the target layer 20, where a mass percentage of the solvent in the photoresist solution is 10% to 30%.

Step S120: Perform soft baking on the target layer coated with the photoresist solution, to evaporate a solvent in the photoresist solution, wherein the photoresist composition is attached to the target layer to form the photoresist layer.

Referring to FIG. 6, through soft baking, the target layer 20 coated with the photoresist solution is heated, and a part of the photoresist solution escapes under heat, so that the content of the solvent in the photoresist solution is reduced. The retained photoresist solution forms the photoresist layer 10 on the surface of the target layer 20. The photoresist composition in the photoresist layer 10 has a higher concentration, and the photoresist layer 10 has higher photosensitivity. In some embodiments, the target layer 20 coated with the photoresist solution may be placed in a 100° C. environment for 60 seconds.

Figure 3:
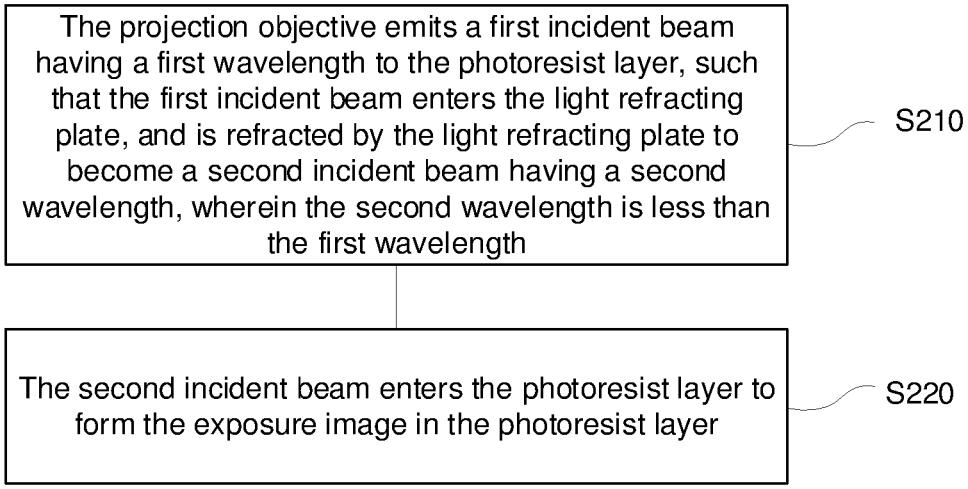
FIG. 3 is a flowchart of an exposure process in a method of forming a photoresist pattern according to an exemplary embodiment.

According to an exemplary embodiment, the implementation of step S200 is described in some embodiments. As shown in FIG. 3, the implementation process includes the following steps:

S210: The projection objective emits a first incident beam having a first wavelength to the photoresist layer, such that the first incident beam enters the light refracting plate, and is refracted by the light refracting plate to become a second incident beam having a second wavelength, wherein the second wavelength is less than the first wavelength.

As shown in FIG. 7, the first incident beam 5 is a beam that is emitted by the projection objective 42 and has a first wavelength $\lambda 1$; the second incident beam 6 is a beam that has passed through the light refracting plate 43 and has a second wavelength $\lambda 2$, where the second wavelength is less than the first wavelength, that is, $\lambda 2 < \lambda 1$.

S220: The second incident beam enters the photoresist layer to form the exposure image in the photoresist layer.

In some embodiments, the light refracting plate 43 refracts the first incident beam 5, to convert the first incident beam 5 into the second incident beam 6 having a smaller wavelength. The second incident beam 6 enters the photoresist layer 10, to form the exposure image with higher lithographic resolution.

In some embodiments, the light refracting plate 43 is arranged on a propagation path along which the incident beam enters the photoresist layer 10. A refractive index of the light propagation medium changes, to convert the first incident beam 5 into a second incident beam 6 with a smaller wavelength, which reduces the wavelength of optical waves entering the photoresist layer 10 and overcomes the difficulty in further reducing the wavelength of optical waves emitted by lithography equipment due to restrictions of the equipment and process development in the photolithography process.

In some embodiments, a thickness h1 of the light refracting plate 43 is greater than 1/10 of the first wavelength λ1, such that the first incident beam 5 can be refracted by the light refracting plate 43 when passing through the light refracting plate.

Figure 8:
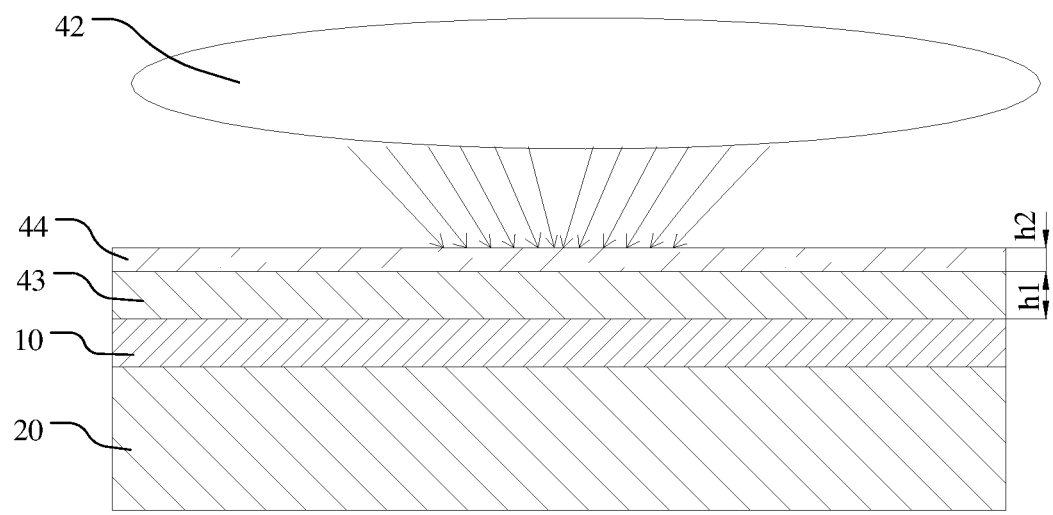
FIG. 8 is a schematic diagram of exposure processing performed by a projection exposure apparatus on a photoresist layer according to an exemplary embodiment.

According to an exemplary embodiment, the exposure processing is performed in a first medium. The first incident beam 5 emitted by the projection objective 42 to the photoresist layer 10 passes through the first medium before entering the photoresist layer 10. That is, as shown in FIG. 8, the projection exposure apparatus 40 further includes a first medium layer 44. The first medium layer 44 is disposed between the projection objective 42 and the photoresist layer 10. The first medium layer 44 includes a first medium. For example, the first medium is water or air.

Figure 4:
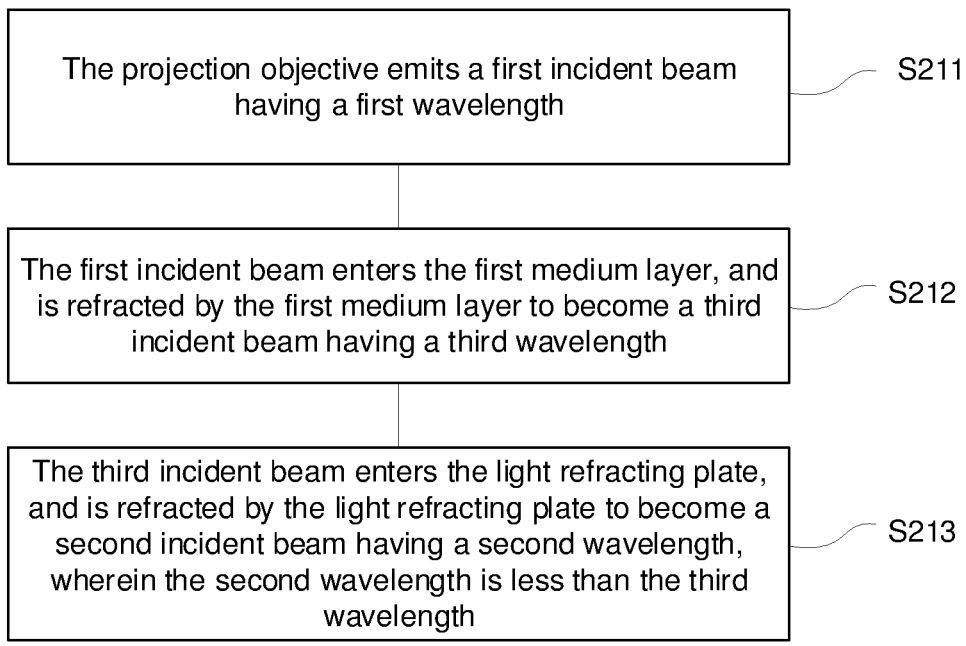
FIG. 4 is a flowchart of an exposure process in a method of forming a photoresist pattern according to an exemplary embodiment.

In some embodiments, the first medium layer 44 is formed between the projection objective 42 and the light refracting plate 43. As shown in FIG. 4, step S210 includes the following steps:

S211: The projection objective emits a first incident beam having a first wavelength.

S212: The first incident beam enters the first medium layer, and is refracted by the first medium layer to become a third incident beam having a third wavelength.

S213: The third incident beam enters the light refracting plate, and is refracted by the light refracting plate to become a second incident beam having a second wavelength, wherein the second wavelength is less than the third wavelength.

As shown in FIG. 8, the third incident beam is a beam that has been refracted by the first medium layer 44 and has a third wavelength λ3, and the second incident beam 6 is a beam that has been refracted by the light refracting plate 43 and has a second wavelength λ2, where the second wavelength is less than the third wavelength, that is, λ2<λ3.

In some embodiments, a refractive index of the first medium layer 44 is n1, and a refractive index of the light refracting plate 43 is n2, where n2>n1. That is, the refractive index n2 of the light refracting plate 43 is greater than the refractive index n1 of the first medium layer 44. For example, the light refracting plate 43 may be made of an optical glass with a high refractive index or an organic optical resin with a high refractive index, such as a polyimide film.

When light propagates in two propagation medium layers with different refractive indexes, a relationship between the wavelength and the refractive index is as follows:

$$\lambda 2 = \frac{\lambda 3 \times n1}{n2}.$$

In some embodiments, the refractive index n2 of the light refracting plate 43 is greater than the refractive index n1 of the first medium layer 44. The first incident beam 5 enters the first medium layer 44 from the projection objective 42, and is refracted by the first medium layer 44 to become the third incident beam. The third incident beam enters the light refracting plate 43 from the first medium layer 44, and is refracted by the light refracting plate 43 to become the second incident beam 6. That is, when the third incident beam enters a propagation medium with a larger refractive index from a propagation medium with a smaller refractive index, the third incident beam becomes the second incident beam 6.

In some embodiments, the refractive index of the light refracting plate 43 refers to a light refractive index of the light refracting plate 43 to the incident beam, and the refractive index of the first medium layer 44 refers to a light refractive index of the first medium layer 44 to the incident beam. For example, when the incident beam is deep ultraviolet (DUV), the refractive index refers to a refractive index to DUV.

In some embodiments, the first medium layer 44 and the light refracting plate 43 are disposed on the propagation path along which the incident beam enters the photoresist layer 10. The refractive index of the light propagation medium changes. The first medium layer 44 converts the first incident beam into the third incident beam with a smaller wavelength. The light refracting plate 43 converts the third incident beam into the second incident beam with a smaller wavelength. In this way, when the incident beam sequentially passes through the first medium layer 44 and the light refracting plate 43 to enter the photoresist layer 10, the incident optical waves are converted twice, that is, the wavelength of the incident optical waves is reduced twice. Through the impact of the propagation medium on the optical wavelength, the wavelength of optical waves for exposure in the photoresist layer 10 to form the exposure image is reduced, which further improves the resolution, such that the formed photoresist pattern has higher precision and quality.

In some embodiments, the refractive index of the light refracting plate 43 is less than the refractive index of the photoresist layer 10. Based on the foregoing relationship between the wavelength and the refractive index, the wavelength of the optical waves entering the photoresist layer 10 can further be reduced.

Figure 9:
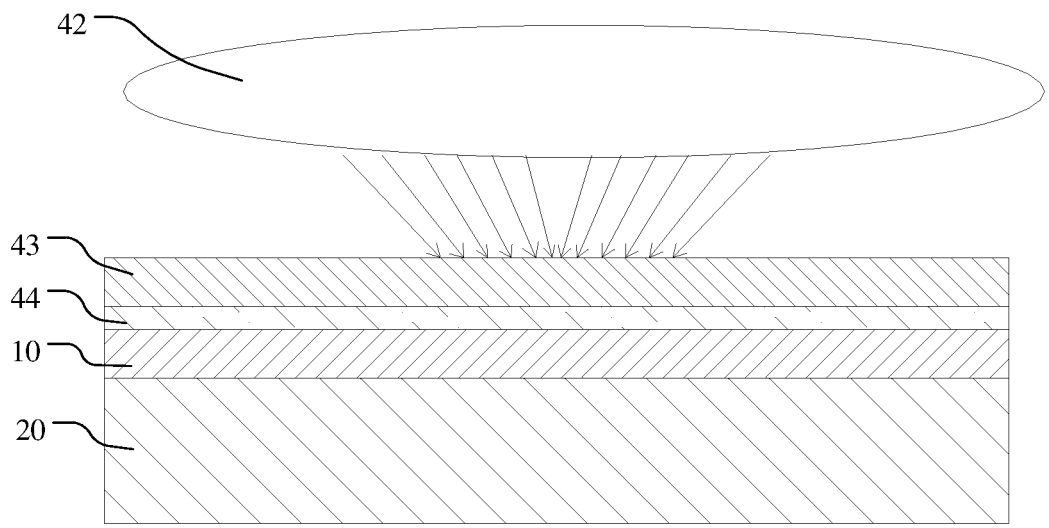
FIG. 9 is a schematic diagram of exposure processing performed by a projection exposure apparatus on a photoresist layer according to an exemplary embodiment.

According to an exemplary embodiment, as shown in FIG. 8, a thickness h2 of the first medium layer 44 is less than a thickness h1 of the light refracting plate 43, to prevent the first medium layer 44 from absorbing excessive optical waves, ensuring the transmittance of the incident beam entering the photoresist layer 10 from the light refracting plate 43. In some embodiments, the thickness h2 of the first medium layer 44 is set to be as small as possible, to reduce optical waves absorbed by the first medium layer 44 and improve the light transmittance of the incident beam, such that the formed exposure image has higher precision. According to an exemplary embodiment, as shown in FIG. 9, the first medium layer 44 is formed between the photoresist layer 10 and the light refracting plate 43. In this way, the first incident beam 5 having the first wavelength emitted by the projection objective 42 enters the light refracting plate 43. The first incident beam 5 is refracted by the light refracting plate 43 to become the second incident beam 6 having the second wavelength. The second incident beam 6 enters the photoresist layer 10 after passing through the first medium layer 44.

The refractive index of the light refracting plate 43 is greater than the refractive index of the first medium layer 44 and less than the refractive index of the photoresist layer 10. For example, when the first medium 3 is air, the refractive index n2 of the light refracting plate 43 is greater than 1; when the first medium 3 is water, the refractive index n2 of the light refracting plate 43 is greater than 1.44. On the one hand, the material of the light refracting plate 43 is more flexible, which helps further reduce the cost. On the other hand, the light refracting plate 43 can be used to refract optical waves to reduce the wavelength of the optical waves. The thickness of the first medium layer 44 is less than 1/10 of the second wavelength, such that the change in the wavelength of the second incident beam when entering the first medium layer 44 can be ignored, which avoids increasing the wavelength of the optical waves when the beam is refracted by the first medium layer 44, thereby ensuring that the optical waves entering the photoresist layer 10 have a relatively small wavelength.

In some embodiments, the light refracting plate 43 and the first medium layer 44 are disposed on the propagation path along which the incident beam enters the photoresist layer 10. The refractive index of the light propagation medium changes. The light refracting plate 43 converts the first incident beam 5 into the second incident beam 6 having a smaller wavelength. Because the thickness of the first medium layer 44 is less than 1/10 of the second wavelength, the change in the wavelength of the second incident beam 6 when passing through the first medium layer 44 can also be neglected. For example, the optical wavelength of the lithography equipment includes, but is not limited to, G-line (436 nm), I-line (365 nm), KrF (248 nm), ArF (193 nm), and extreme ultraviolet (EUV) (13.5 nm). Correspondingly, for example, when KrF lithography equipment is used, the thickness of the first medium layer 44 may be less than 24.8 nm; when ArF lithography equipment is used, the thickness of the first medium layer 44 may be less than 19.3 nm; when EUV lithography equipment is used, the thickness of the first medium layer 44 may be less than 1.35 nm.

Because the refractive index of the photoresist layer 10 is larger, when the beam enters the photoresist layer 10, the wavelength will be further reduced. In this way, when the incident beam sequentially passes through the light refracting plate 43 and the first medium layer 44 to enter the photoresist layer 10, the incident optical waves are converted twice, that is, the wavelength of the incident optical waves is reduced twice. Through the impact of the propagation medium on the optical wavelength, the wavelength of optical waves for exposure in the photoresist layer 10 to form the exposure image is reduced, which further improves the resolution, such that the formed photoresist pattern has higher precision and quality.

Figure 5:
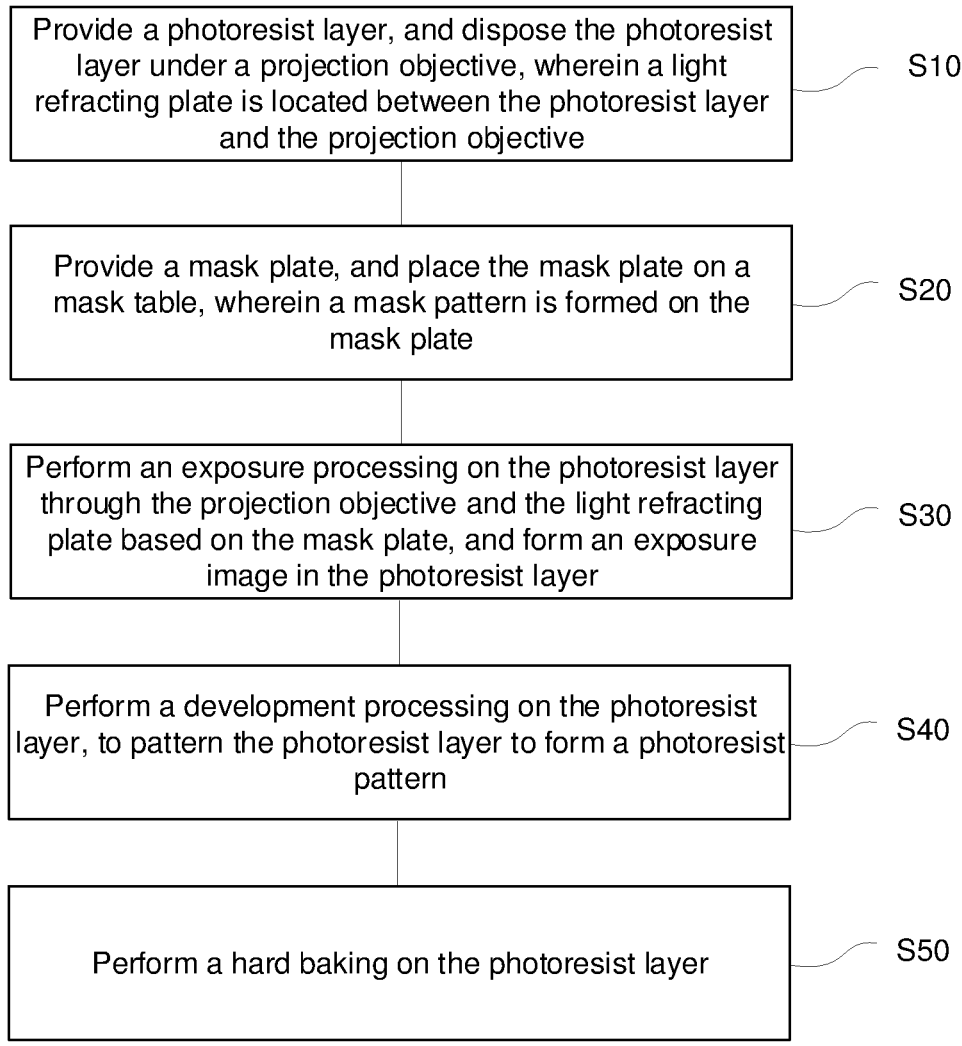
FIG. 5 is a flowchart of a method of forming a photoresist pattern according to an exemplary embodiment.

As shown in FIG. 5, an exemplary embodiment of the present disclosure provides a method of forming a photoresist pattern. The forming method includes:

Step S10: Provide a photoresist layer, and dispose the photoresist layer under a projection objective, wherein a light refracting plate is located between the photoresist layer and the projection objective.

Step S10 in some embodiments is implemented in the same manner as step S100 of the foregoing embodiment, and will not be described in detail again herein.

Step S20: Provide a mask plate, and place the mask plate on a mask table, wherein a mask pattern is formed on the mask plate.

Further referring to FIG. 7, a mask plate 7 is provided. The mask plate 7 includes a mask pattern. The mask plate 7 is disposed between the lighting system 41 and the projection objective 42 of the projection exposure apparatus 40. The photoresist layer 10 is disposed under the projection objective 42. The projection exposure apparatus 40 is adjusted, such that the projection objective 42 is aligned with the photoresist layer 10.

Step S30: Perform an exposure processing on the photoresist layer through the projection objective and the light refracting plate based on the mask plate, and form an exposure image in the photoresist layer.

Figure 10:
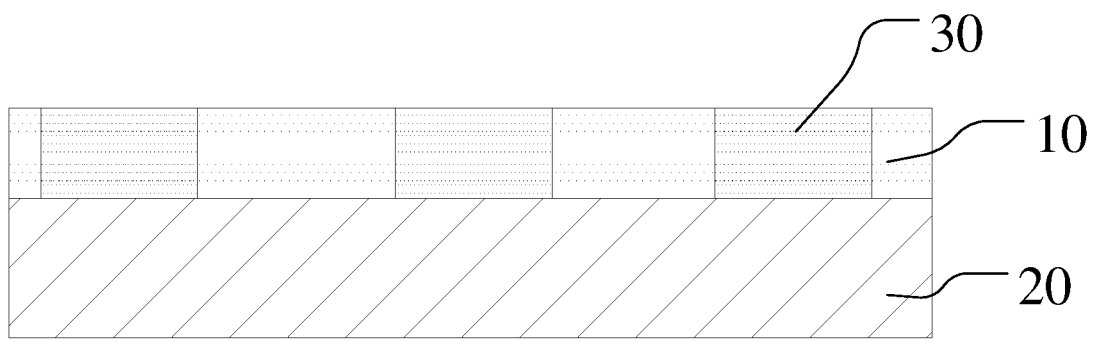
FIG. 10 is a schematic diagram of forming an exposure image in a photoresist layer in a method of forming a photoresist pattern according to an exemplary embodiment.
Figure 11:
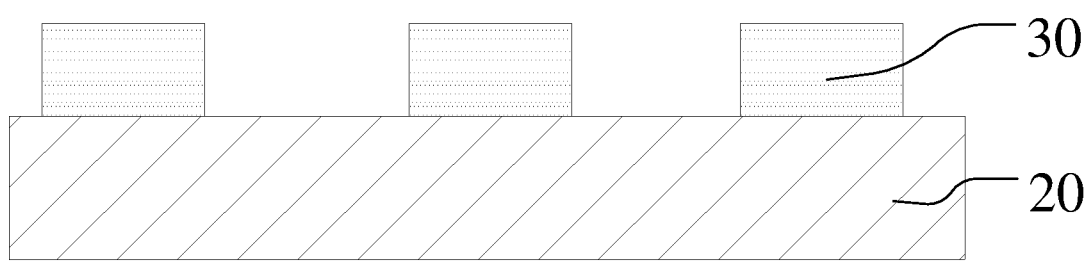
FIG. 11 is a schematic diagram of development processing on a photoresist layer in a method of forming a photoresist pattern according to an exemplary embodiment.

In some embodiments, as shown in FIG. 7 and FIG. 10, the lighting system 41 emits an initial beam to the photoresist layer 10 perpendicularly. A part of the initial beam enters the projection objective 42 through the mask plate 7; the projection objective 42 focuses the initial beam, and refracts the initial beam to be a first incident beam 5, where the first incident beam 5 has a wavelength 21. The first incident beam 5 is refracted by the light refracting plate 43 to be a second incident beam 6 when passing through the light refracting plate 43. The second incident beam 6 has a wavelength $\lambda 2$, and $\lambda 2$ is less than $\lambda 1$. As shown in FIG. 10, the second incident beam 6 enters the photoresist layer 10. The photoresist layer 10 irradiated by the second incident beam 6 senses light and undergoes a photosensitive chemical reaction, to form an exposure image 30, where the exposure image 30 is a micro-image of the mask pattern. The photoresist of the photoresist layer generally can be divided into two types: positive photoresist and negative photoresist. In terms of the photochemical reaction, if long-chain molecules of the polymer in the photoresist composition are truncated into short-chain molecules by light, the photoresist is a positive photoresist; if short-chain molecules of the polymer in the photoresist composition are cross-linked into long-chain molecules by light, the photoresist is a negative photoresist. A short-chain molecular polymer can be dissolved by a developing solution. Therefore, the exposed part of the positive photoresist is removed, while the exposed part of the negative photoresist is retained.

Step S40: Perform a development processing on the photoresist layer, to pattern the photoresist layer to form a photoresist pattern.

Figure 12:
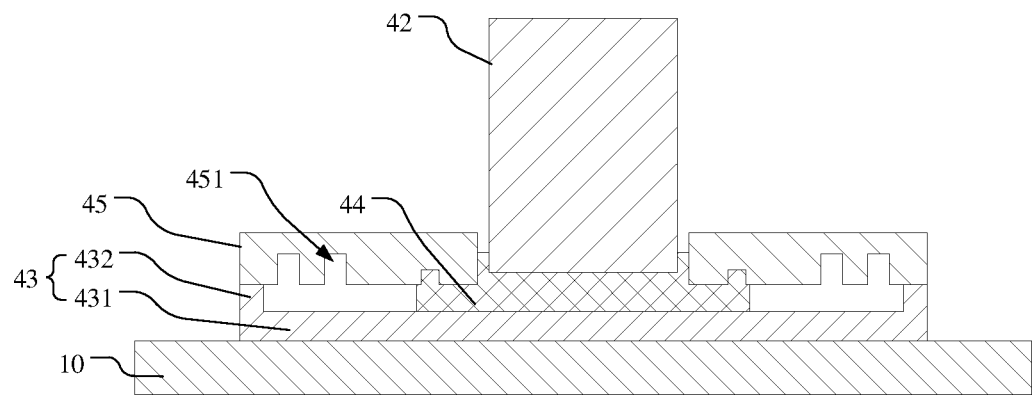
FIG. 12 is a schematic diagram of an exposure process performed by a projection exposure apparatus according to an exemplary embodiment.

As shown in FIG. 12, a developing solution is sprayed to the photoresist layer 10. The developing solution is distributed over the entire surface of the photoresist layer 10, such that the photoresist layer 10 can be completely submerged in the developing solution. The developing solution reacts with a soluble region in the photoresist layer 10, to dissolve the soluble region in the photoresist layer 10, so that the exposure image 30 is developed in the photoresist layer to form the photoresist pattern.

In some embodiments, a development time is adjusted according to the components of the photoresist layer 10 and the concentration of the developing solution, such that the soluble photoresist layer 10 can be fully dissolved in the developing solution without causing overdevelopment that affects the contour of the formed photoresist pattern.

After the development processing for the photoresist layer 10, the photoresist layer 10 is cleaned, to remove the developing solution in which the photoresist is dissolved and the excess developing solution. Deionized water may be sprayed to the photoresist layer 10. The deionized water flows to take away the developing solution in which the photoresist is dissolved and the excess developing solution.

Step S50: Perform a hard baking on the photoresist layer.

Hard making is performed on the retained photoresist layer 10 at a temperature of 130° C. to 200° C. The hard making lasts 20 to 40 minutes, such that the solvent in the photoresist layer 10 escapes completely, while the photoresist layer 10 is further polymerized to enhance its etching resistance.

In the forming method according to some embodiments, the light refracting plate 43 improves the lithographic resolution of the photoresist pattern. The photoresist pattern is a micro-image of the mask pattern, and the formed photoresist pattern has a clearer boundary, and the photoresist pattern has high dimensional precision.

According to a second aspect, the present disclosure provides a projection exposure apparatus. As shown in FIG. 7, the projection exposure apparatus 40 includes a lighting system 41, a projection objective 42, and a light refracting plate 43. The lighting system 41 is configured to emit an initial beam. The projection objective 42 is configured to transmit the initial beam. The light refracting plate 43 is disposed at one side (light exit side) of the projection objective 42. In this way, the initial beam emitted by the lighting system 41 is transmitted to the light refracting plate 43 through the projection objective 42, and enters the photoresist layer 10 after being refracted by the light refracting plate 43. The light refracting plate 43 is configured to reduce a wavelength of the beam emitted by the projection objective 42, such that the optical waves entering the photoresist layer 10 has a smaller wavelength, thus improving the lithographic resolution. Therefore, the projection exposure apparatus 40 according to some embodiments can form an exposure image with higher precision on the photoresist layer 10, thus implementing exposure processes with a smaller lithographic critical dimension and more complex and diverse structures.

In some embodiments, a thickness h1 of the light refracting plate 43 is greater than 1/10 of the wavelength of the incident beam emitted by the projection objective 42, such that the beam can be refracted by the light refracting plate 43 when passing through the light refracting plate. Correspondingly, for example, when KrF lithography equipment is used, the thickness h1 of the light refracting plate 43 may be greater than 24.8 nm; when ArF lithography equipment is used, the thickness h1 of the light refracting plate 43 may be greater than 19.3 nm; when EUV lithography equipment is used, the thickness h1 of the light refracting plate 43 may be greater than 1.35 nm.

According to an exemplary embodiment, as shown in FIG. 12, the projection exposure apparatus 40 further includes a first medium layer 44. The first medium layer 44 is disposed between the light refracting plate 43 and the projection objective 42. The first medium layer 44 includes a first medium. For example, the first medium is water or air. A refractive index of the first medium layer 44 is n1, and a refractive index of the light refracting plate 43 is n2, where n2>n1. In this way, when the beam emitted by the projection objective 42 sequentially passes through the light refracting plate 43 and the first medium layer 44 to enter the photoresist layer 10, the incident optical waves are converted twice, that is, the wavelength of the incident optical waves is reduced twice. Through the impact of the propagation medium on the optical wavelength, the wavelength of optical waves for exposure in the photoresist layer 10 to form the exposure image is reduced, which further improves the resolution, such that the formed photoresist pattern has higher precision and quality.

In some embodiments, the refractive index of the light refracting plate 43 is less than the refractive index of the photoresist layer 10. Based on the foregoing relationship between the wavelength and the refractive index, the wavelength of the optical waves entering the photoresist layer 10 can further be reduced.

According to an exemplary embodiment, a thickness h2 of the first medium layer 44 is less than a thickness h1 of the light refracting plate 43, to prevent the first medium layer 44 from absorbing excessive optical waves, ensuring the transmittance of the incident beam entering the photoresist layer 10 from the light refracting plate 43. In some embodiments, the thickness h2 of the first medium layer 44 is set to be as small as possible, to reduce optical waves absorbed by the first medium layer 44 and improve the light transmittance of the incident beam, such that the formed exposure image has higher precision.

In some embodiments, as shown in FIG. 12, the projection exposure apparatus 40 further includes an objective surrounding structure 45. The objective surrounding structure 45 surrounds a bottom of the projection objective 42. The light refracting plate 43 is connected to the objective surrounding structure 45. For example, the light refracting plate 43 is connected to the objective surrounding structure 45 through adhesion in other manners, to fasten the light refracting plate 43 on the projection exposure apparatus 40. In an example, the light refracting plate 43 includes a refracting plate body 431 and a connection portion 432 surrounding the refracting plate body 431. The refracting plate body 431 is located right below the projection objective 42. A third incident beam is refracted by the refracting plate body 431 to become a second incident beam 6. The connection portion 432 located on the periphery of the refracting plate body 431 is connected to the objective surrounding structure 45.

Referring to FIG. 12, the objective surrounding structure 45 is provided with a first medium defining portion 451. The first medium defining portion 451 surrounds the first medium layer 44 and is configured to define a region where a first medium, such as water, is located, to avoid leakage of the first medium. In an example, the first medium defining portion 451 includes an air outlet. Gas discharged via the air outlet forms a barrier, which helps avoid leakage of the first medium. The light refracting plate 43 is connected to the periphery of the first medium defining portion 451. In an example, as shown in FIG. 12, the connection portion 432 of the light refracting plate 43 is connected to the periphery of the first medium defining portion 451, such that the light refracting plate 43 does not affects the definition of the region of the first medium by the first medium defining portion 451.

Figure 13:
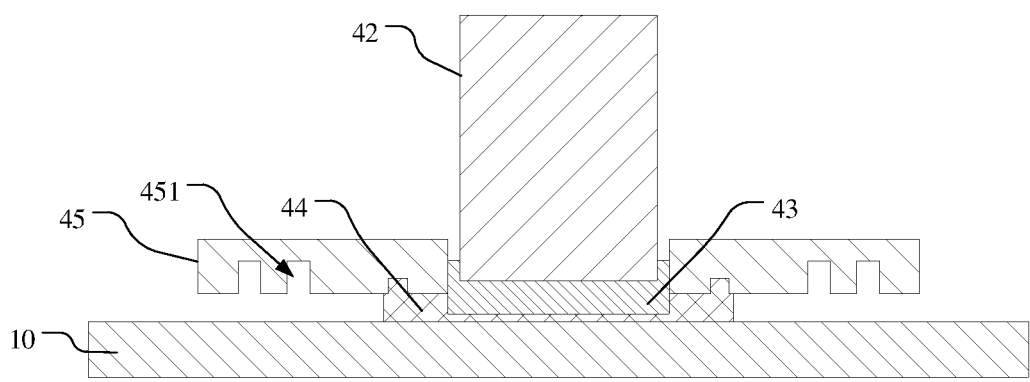
FIG. 13 is a schematic diagram of an exposure process performed by a projection exposure apparatus according to an exemplary embodiment.

According to an exemplary embodiment, as shown in FIG. 13, the light refracting plate 43 is attached to the bottom of the projection objective 42. The light refracting plate 43 may be connected to the projection objective 42 through adhesion or in other manners. In an example, the light refracting plate 43 is cap-shaped, and is fastened at the bottom of the projection objective 42, to improve the reliability of the connection between the light refracting plate 43 and the projection objective 42. In some embodiments, when the projection exposure apparatus is used, the first medium layer 44 may be disposed between the projection exposure apparatus 40 and the photoresist layer 10, e.g., between the light refracting plate 43 and the photoresist layer 10. In some embodiments, a refractive index of the light refracting plate 43 is greater than a refractive index of the first medium layer 44, and the refractive index of the light refracting plate 43 is less than a refractive index of the photoresist layer 10. On the one hand, the material of the light refracting plate 43 is more flexible, which helps further reduce the cost. On the other hand, the light refracting plate 43 can be used to refract optical waves to reduce the wavelength of the optical waves.

In the process of using the projection exposure apparatus 40, the thickness of the first medium layer 44 is controlled to be less than 1/10 of the second wavelength, such that the change in the wavelength of the second incident beam 6 when entering the first medium layer 44 can be ignored, which avoids increasing the wavelength of the optical waves when the beam is refracted by the first medium layer 44, thereby ensuring that the optical waves entering the photoresist layer 10 have a relatively small wavelength. It can be understood that, the thickness of the first medium layer 44 refers to a thickness of the first medium layer 44 that is located between the light refracting plate 43 and the photoresist layer 10. Through the impact of the propagation medium on the optical wavelength, the wavelength of optical waves for exposure in the photoresist layer 10 to form the exposure image is reduced, which further improves the resolution, such that the formed photoresist pattern has higher precision and quality.

In some embodiments, as shown in FIG. 13, the projection exposure apparatus 40 further includes an objective surrounding structure 45. The objective surrounding structure 45 surrounds the projection objective 42. The objective surrounding structure 45 is provided with a first medium defining portion 451. The first medium defining portion 451 surrounds the first medium layer 44 and is configured to define a region where a first medium, such as water, is located, to avoid leakage of the first medium. In an example, the first medium defining portion 451 includes an air outlet. Gas discharged via the air outlet forms a barrier, which helps avoid leakage of the first medium.

In the method of forming a photoresist pattern and the projection exposure apparatus provided by the embodiments of the present disclosure, the light refracting plate disposed between the photoresist layer and the projection objective reduces the wavelength of optical waves entering the photoresist layer, thereby improving the resolution and the precision of the photoresist pattern.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the method of forming a photoresist pattern and the projection exposure apparatus provided by the embodiments of the present disclosure, the light refracting plate disposed between the photoresist layer and the projection objective reduces the wavelength of optical waves entering the photoresist layer, thereby improving the resolution and the precision of the photoresist pattern.

The invention claimed is:

1. A method of forming a photoresist pattern, applied to a projection exposure apparatus comprising a projection objective, a light refracting plate being connected to an objective surrounding structure surrounding a bottom of the projection objective, and a first medium layer provided by the objective surrounding structure, wherein the first medium layer is disposed between the light refracting plate and the projection objective and contacts the light refracting plate and the projection objective, a thickness of the first medium layer is less than a thickness of the light refracting plate, and the light refracting plate is made of a polyimide film, and the method comprising:

providing a photoresist layer, and disposing the photoresist layer under the projection objective, wherein the light refracting plate is located between the photoresist layer and the projection objective; and performing an exposure processing on the photoresist layer through the projection objective and the light refracting plate, and forming an exposure image in the photoresist layer, wherein the light refracting plate is configured to reduce a wavelength of optical waves entering the photoresist layer.

2. The method of forming a photoresist pattern according to claim 1, wherein the light refracting plate contacts a photoresist layer, wherein the performing an exposure processing on the photoresist layer through the projection objective and the light refracting plate, and forming an exposure image in the photoresist layer comprises:

emitting, by the projection objective, a first incident beam having a first wavelength to the photoresist layer, such that the first incident beam enters the light refracting plate, and is refracted by the light refracting plate to become a second incident beam having a second wavelength, wherein the second wavelength is less than the first wavelength; and transmitting the second incident beam to the photoresist layer, such that the second incident beam forms the exposure image in the photoresist layer.

3. The method of forming a photoresist pattern according to claim 2, wherein the exposure processing is performed in the first medium, and the first incident beam emitted by the projection objective to the photoresist layer passes through a first medium layer before entering the photoresist layer.

4. The method of forming a photoresist pattern according to claim 1, wherein the projection exposure apparatus comprises a mask table, and the method further comprises:

providing a mask plate, and placing the mask plate on the mask table, wherein a mask pattern is formed on the mask plate; and performing an exposure processing on the photoresist layer based on the mask plate.

5. The method of forming a photoresist pattern according to claim 1, wherein the light refracting plate contacts a photoresist layer.

6. The method of forming a photoresist pattern according to claim 5, wherein the light refracting plate is made of an optical glass or an organic optical resin.

7. The method of forming a photoresist pattern according to claim 1, the light refracting plate includes a refracting plate body and a connection portion surrounding the refracting plate body, wherein the connection portion located on a periphery of the refracting plate body is connected to the objective surrounding structure.

8. The method of forming a photoresist pattern according to claim 7, wherein the first medium layer comprises water, the objective surrounding structure is provided with a first medium defining portion including an air outlet to discharge gas, the first medium defining portion surrounds the first medium layer and is configured to define a region where a first medium is located to avoid leakage of the first medium; the connection portion of the light refracting plate is connected to a periphery of the first medium defining portion.

9. The method of forming a photoresist pattern according to claim 1, wherein the thickness of the first medium layer is less than 24.8 nm.

10. A projection exposure apparatus, comprising:

a lighting system, configured to emit an initial beam;

a projection objective, configured to transmit the initial beam and emit an incident beam;

a light refracting plate, disposed at a side of the projection objective, and configured to reduce a wavelength of the incident beam emitted by the projection objective, wherein the light refracting plate is made of a polyimide film;

a first medium layer, disposed between the light refracting plate and the projection objective, wherein a thickness of the first medium layer is less than a thickness of the light refracting plate, and the first medium layer contacts the light refracting plate and the projection objective; and an objective surrounding structure, surrounding a bottom of the projection objective, wherein the light refracting plate is connected to the objective surrounding structure, and the objective surrounding structure is configured to provide the first medium layer.

11. The projection exposure apparatus according to claim 10, wherein a thickness of the light refracting plate is greater than 1/10 of a wavelength of the incident beam emitted by the projection objective.

12. The projection exposure apparatus according to claim 10, wherein a refractive index of the light refracting plate is greater than a refractive index of the first medium layer.

13. The projection exposure apparatus according to claim 10, wherein the first medium layer comprises a first medium, and the first medium is water or air.

14. The projection exposure apparatus according to claim 10, wherein the light refracting plate is made of an optical glass or an organic optical resin.

15. The projection exposure apparatus according to claim 10, the light refracting plate includes a refracting plate body and a connection portion surrounding the refracting plate body, wherein the connection portion located on a periphery of the refracting plate body is connected to the objective surrounding structure.

16. The projection exposure apparatus according to claim 15, wherein the first medium layer comprises water, the objective surrounding structure is provided with a first medium defining portion including an air outlet to discharge gas, the first medium defining portion surrounds the first medium layer and is configured to define a region where a first medium is located to avoid leakage of the first medium; the connection portion of the light refracting plate is connected to a periphery of the first medium defining portion.

17. The projection exposure apparatus according to claim 10, wherein the thickness of the first medium layer is less than 24.8 nm.

18. A projection exposure apparatus, comprising:

a lighting system, configured to emit an initial beam;

a projection objective, configured to transmit the initial beam and emit an incident beam;

a light refracting plate, disposed at a side of the projection objective, and configured to reduce a wavelength of the incident beam emitted by the projection objective, wherein the thickness of the first medium layer is less than 24.8 nm;

a first medium layer, disposed between the light refracting plate and the projection objective, wherein a thickness of the first medium layer is less than a thickness of the light refracting plate, and the first medium layer contacts the light refracting plate and the projection objective; and an objective surrounding structure, surrounding a bottom of the projection objective, wherein the light refracting plate is connected to the objective surrounding structure, and the objective surrounding structure is configured to provide the first medium layer.

* * * * *